United States Patent [19]

Wagner

[11] Patent Number: 5,546,079

[45] Date of Patent: Aug. 13, 1996

[54] OUTPUT CIRCUIT ARRANGEMENT INTEGRATED IN AN INTEGRATED ELECTRIC CIRCUIT FOR SUPPLYING AN OUTPUT SIGNAL DETERMINED BY USER SELECTABLE PARAMETERS

[75] Inventor: Roman Wagner, Kümmersbruck, Germany

[73] Assignee: Siemens Aktiengesellschaft, Munich, Germany

[21] Appl. No.: 971,745

[22] Filed: Nov. 4, 1992

[30] Foreign Application Priority Data

Nov. 19, 1991 [EP] European Pat. Off. ............... 91119773

[51] Int. Cl.[6] .................................................. G08C 19/04
[52] U.S. Cl. .................. 340/870.39; 340/660; 340/664; 340/870.04; 340/870.42; 324/123 R; 307/125; 307/130; 307/131
[58] Field of Search ...................... 340/870.04, 870.13, 340/870.39, 870.42, 510, 511, 657–664, 825.03; 364/180, 181; 324/123 R; 307/31, 115, 125, 130, 131

[56] References Cited

U.S. PATENT DOCUMENTS

| | | | |
|---|---|---|---|
| 3,764,983 | 10/1973 | Stok | 340/870.13 |
| 4,591,855 | 5/1986 | Blackburn | 340/870.39 |
| 4,652,821 | 5/1987 | Kreft | 340/870.13 |
| 4,783,659 | 11/1988 | Frick | 340/870.04 |
| 4,804,958 | 2/1989 | Longsdorf | 340/870.42 |
| 4,875,041 | 10/1989 | Dannenberg | 340/870.13 |
| 4,952,934 | 8/1990 | Chiriatti | 307/125 |
| 5,081,571 | 1/1992 | Rumold | 364/181 |
| 5,253,511 | 10/1993 | Jaramillo et al. | 340/870.04 |

FOREIGN PATENT DOCUMENTS

| | | |
|---|---|---|
| 0281416 | 9/1988 | European Pat. Off. . |
| 0374293 | 6/1990 | European Pat. Off. . |

OTHER PUBLICATIONS

ELEKTRONIK 16/1992, James J. Pinto: *Der flexible E/A–Knoten* .

*Data Conversion Seminar*, pp. I-38 through I-40 (Jul. 1984).

IBM TECHNICAL DISCLOSURE BULLETIN, vol. 32, No. 12, May 1990: *Selective Full or Partial Swing Output Level Converter*, pp. 211–212.

Primary Examiner—John K. Peng
Assistant Examiner—Daniel J. Wu
Attorney, Agent, or Firm—Kenyon & Kenyon

[57] ABSTRACT

An output circuit in which both the signal type (i.e., current or voltage) as well as the signal level range (for example, 0 to 10 V, −10 V to +10 V) are based on user input parameters. The circuit is integrated in an application-specific integrated circuit (i.e., ASIC).

36 Claims, 3 Drawing Sheets

OUTPUT CIRCUIT ARRANGEMENT INTEGRATED IN AN INTEGRATED ELECTRIC CIRCUIT FOR SUPPLYING AN OUTPUT SIGNAL DETERMINED BY USER SELECTABLE PARAMETERS

BACKGROUND OF THE INVENTION

The present invention relates to an electronic output circuit arrangement for outputting electric signals, preferably analog signals.

Such circuit arrangements are known, for example, from analog output modules used for modular programmable controllers. These modules usually include circuit arrangements, having a predetermined signal type (i.e., current or voltage) and a predetermined signal level range. A circuit arrangement configured on the module may output a voltage of signal between 0 and +10 V, for example. Another circuit arrangement may output a current signal between +20 and −20 mA, for example.

This type of fixed allocation of signal levels to individual circuit arrangements is disadvantageous in a number of ways. First, a danger of faulty wiring exists. Second, an increased stockkeeping of spare parts is necessary. Third, output channels, which are available in principle, cannot always be utilized, because they may supply a signal which is unsuitable for the particular application.

The object of the present invention is to provide the user with a small, inexpensive circuit arrangement, which can be flexibly adapted to meet the requirements of different specific applications.

SUMMARY OF THE INVENTION

This objective is solved by integrating a circuit arrangement adapted to accept parameters specified by the user to determine its signal-level range in an integrated electric circuit (IC), and in particular, in an application-specific integrated electric circuit (ASIC). In addition to realizing a small and inexpensive output circuit arrangement, the circuit arrangement can be operated as a voltage-output circuit or as a current-output circuit depending on a signal type parameter which can be specified by the user. Operating the circuit arrangement based on a signal-level parameter, which can be specified by the user, in one of several signal-level ranges is also possible.

Feeding back both the current value and the voltage value of the output circuit arrangement into the output circuit arrangement is advantageous. The value representing the signal to be output is supplied to a feedback circuit to stabilize the signal to be output. The other value (i.e., the value not representing the signal to be output) is at least supplied to an evaluation circuit such that the output-signal line may be monitored for line faults, such as open circuits or short circuits.

The circuit arrangement is preferably miniaturized, i.e., it is a preferably component of an integrated electric circuit. The electric circuit preferably has several output circuits, which, for economic reasons, receive setpoint output signals via a shared digital-to-analog converter, preferably on a time-division multiplex basis. In this manner, a high level of integration can be achieved.

When at least one output circuit has an additional external circuit element for changing (e.g., amplifying) the signal-level range, the electric circuit does not have to be rated for voltages up to at least 10 V such that a supply with a considerably lower voltage suffices.

When the electric circuit has a logic unit for triggering and monitoring the output circuits as well as for communicating with a central processing unit that supervises the integrated electric circuit, the higher-level central processing unit is relieved of some triggering and monitoring tasks.

DETAILED DESCRIPTION

Figure 1:
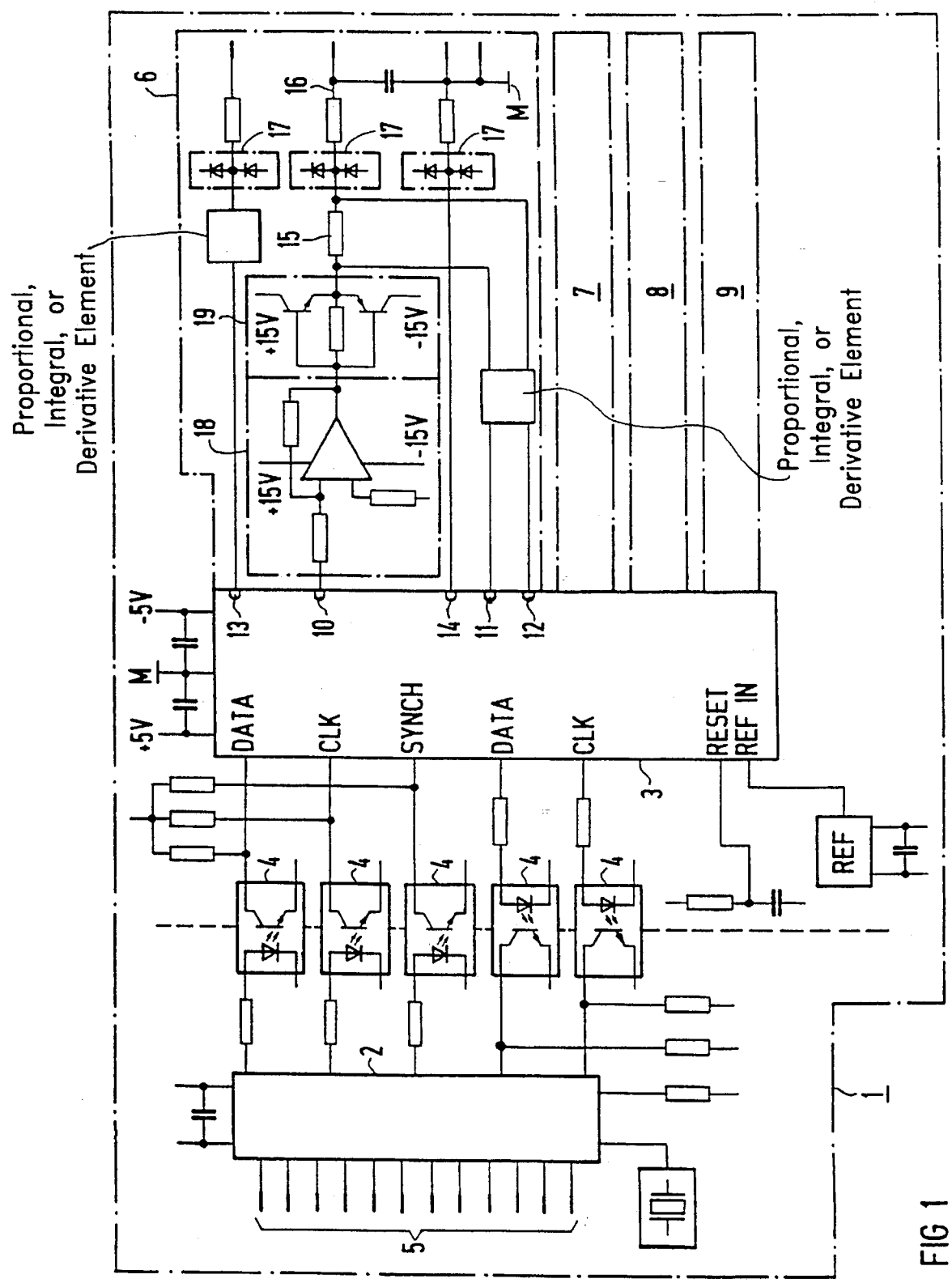
FIG. 1 is a block diagram of an analog output module.
Figure 3:
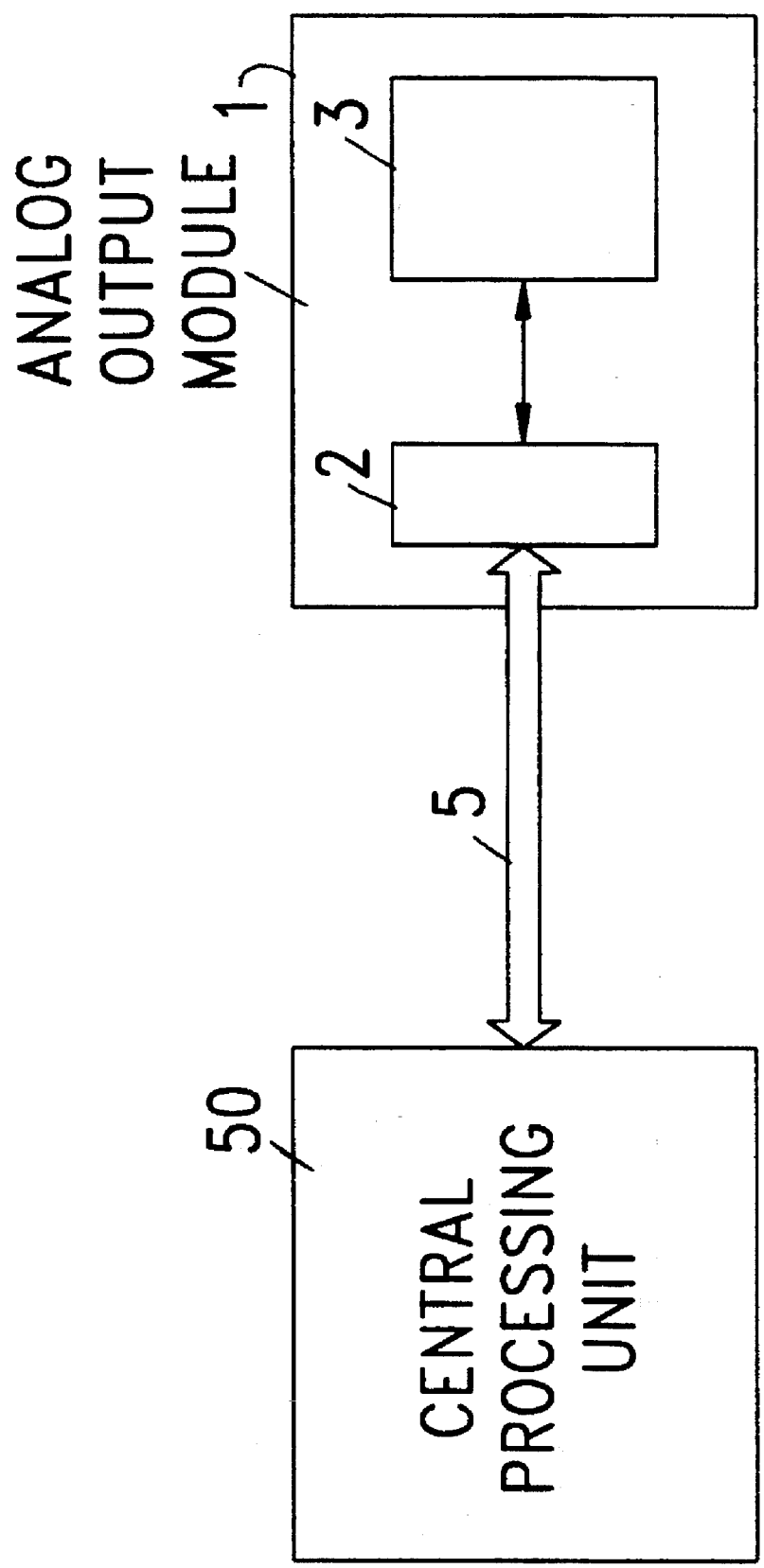
FIG. 3 is a block diagram showing an analog output module of the present invention coupled to a processor.

As shown in FIG. 1, an analog output module 1 includes two galvanically separate, application-specific, electric circuits 2, 3, which are coupled to one another via switches 4 (e.g., optocouplers). As shown in FIG. 3, the electric circuit 2 is an interface electric circuit which is connected to the bus 5 of a programmable controller. Data is exchanged between the output electric circuit 3 and a higher-level central processing unit (CPU) 50 via the bus 5. A parallel-serial conversion, for example, takes place in the interface electric circuit 2. Optionally, a conversion to a standard interface may also take place in the interface electric circuit 2.

The output electric circuit 3 serves to output analog signals to final controlling elements (not shown). The output electric circuit 3 is manufactured using CMOS technology to keep the internal losses to a minimum. Furthermore, the electric circuit 3 is electrically connected to supply voltages +5 V, −5 V and to ground M. Thus, the electric circuit 3 can supply an output signal having a maximum range of +5 through −5 V. Voltages of up to +/−10 V, for example, can be supplied when the output signals of the electric circuit 3 are amplified by additional external circuit elements. By employing additional external circuit elements 18, 19, the output signals of the electric circuit 3 are amplified to the voltage level required by the specific application and are also driven with correspondingly high amperages.

As shown in FIG. 1, the output electric circuit 3 has four output channels 6 through 9. Of the output channels 6 through 9, only output channel 6 is shown in detail for the sake of clarity. Each output channel is electrically connected to five connector pins 10 through 14 of the output electric circuit 3. These connector pins are assigned as follows:

the current output signal of the channel is output via the output connector pin 10;

the voltage, which drops across the resistor 15, is measured by means of the current-feedback connector pins 11 and 12. Since the voltage dropping across the resistor 15 is proportional to the current I flowing through the resistor 15 and, consequently, to the current I in the output line 16, the current I flowing in the output line 16 can thus be determined. A precision resistor is preferably used as the resistor 15 to afford the most accurate measurement;

the voltage U applied to the load (not shown) is measured and provided to the voltage-feedback connector pin 13; and the instantaneous ground level of the load is measured by means of the ground-feedback connector pin 14.

The rectifier bridges 17 depicted in FIG. 1 constitute a protective structure and serve to suppress voltage surges.

They are switched in the blocking direction and connected up to the supply, in this case +15 V and −15 V.

In an alternate embodiment, to reduce the number of required connector pins, the connector pins 12 and 13 can be consolidated, and bin 14 can be dispensed with. While the measuring accuracy is diminished in such an alternate embodiment, this may be acceptable under certain applications.

As mentioned above, the output electric circuit 3 is only supplied with voltages of between +5 and −5 V. Therefore, its output signals are limited to this voltage range. The output voltage at the output connector pin 10 is amplified by a generally known amplifier circuit 18 so that voltages of between +10 and −10 V may be supplied to the output line 16.

Likewise, a generally known driver circuit 19 is configured after the amplifier circuit 18 so that the output line 16 may be supplied with the required current I by means of the driver circuit 19, without causing the voltage U, which is applied to the line 16, to drop.

Figure 2:
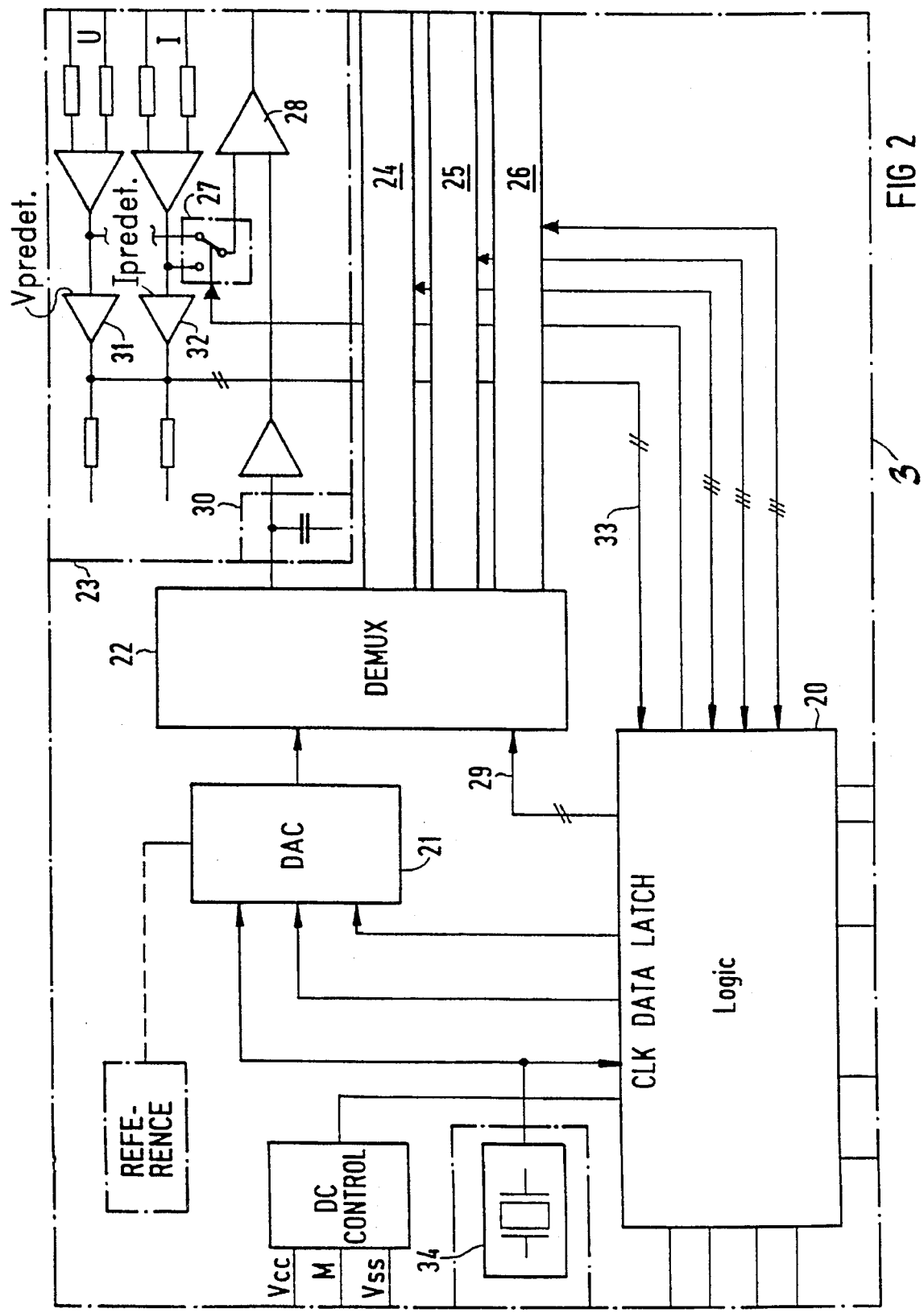
FIG. 2 is a block diagram of an analog output circuit.

FIG. 2 shows the internal design of the output electric circuit 3. According to FIG. 2, the output electric circuit 3 includes a logic unit 20, a digital-to-analog converter 21, a demultiplexer 22, and four output circuits 23 through 26. Of the output circuits 23 through 26, only circuit 23 is shown in detail for the sake of clarity. The logic unit 20 performs several functions within the output electric circuit 3. First, communication between the central processing unit 50 and the output electric circuit 3 takes place via the logic unit 20. Second, the logic unit 20 stores commands and parameters transmitted by the central processing unit. Third, the logic unit 20 triggers the output circuits 23 through 26. Furthermore, the logic unit 20 monitors the operation of the output circuits 23 through 26.

During the initial operation of the output module 1, or after a reset operation, the output electric circuit 3 is always provided with new parameters. To this end, the central processing unit informs the output electric circuit 3 which of the four output circuits 23 through 26 are to handle output signals, whether a voltage or a current signal is supposed to be output, and also which signal-level range is to be adjusted at any one time. These parameters are stored in a parameter register (not shown) of the logic unit 20.

The individual output circuits 23 through 26 which are not activated, are not considered when the output circuits 23 through 26 are cyclically supplied with signals to be output. Setting the signal type, i.e., current or voltage output, is achieved by means of the switch 27. Depending on the position of the switch 27, one of either the current or the voltage signal is fed back to the controller 28. The signal is adapted to the signal-level range within the logic unit 20 through the appropriate conversion of the last transmitted digital signal into the value corresponding to the preselected signal-level range. In the present case, the voltage ranges are 0 through 10 V and −10 V through +10 V. The current ranges are 4 through 20 mA and −20 mA through +20 mA. Of course, other voltage ranges or current ranges, for example 0 to 1 V, or −1 V to 1 V, are also conceivable, however.

The last transmitted values for the individual output channels are cyclically retrieved from registers of the logic unit 20. They are converted by the logic unit 20 according to the selected type of signal and the selected signal-level range into a new digital value and then transmitted to the digital-to-analog converter 21. This converter converts the digital value into an analog value. It then transmits the analog value to the demultiplexer 22, which applies the analog signal to be output, one after another, to the sample-and-hold circuit 30 of one of the output circuits 23 to 26 based on the signal transmitted on line 29. From there, the signals are supplied as setpoint values to the controller 28. To stabilize the output signal to its setpoint value, the amplifier has an integral control-action component, i.e., a PI-controller (i.e., proportional plus integral) or PID-controller (i.e., proportional plus integral plus derivative).

In an alternate embodiment, rather than having a single digital-to-analog converter 21, an electric circuit 3 having a digital-to-analog converter 21 for each output circuit 23 through 26 is provided.

Both the measured voltage signal U, as well as the measured current signal I, are fed to window comparators 31, 32. When the circuit 23 acts as a voltage-output circuit and when the current I exceeds a certain preset value, a signal indicating a short circuit on the output line 16 is provided to the logic unit 20 via line 33. Analogously, an open circuit is recognized when the circuit 23 acts as a current-output circuit and the voltage U exceeds a predetermined level.

In each case, the channel in question is deactivated and an error message is sent to the central processing unit. The central processing unit can then output an error message to the user.

If the measured current and voltage signals are noisy, a known smoothing operation may be used inside and/or outside of the output electric circuit.

The invention as described above is preferably used with analog output modules. In principle however, the present invention may also be used with digital output modules. When such a use is desired, naturally the digital-to-analog converter 21 is not required.

What is claimed is:

1. An integrated circuit comprising an electronic output circuit, said electronic output circuit adapted to output electric signals, and having a signal-level range based on user input parameters, wherein said output signals include at least one of current values and voltage values and further including:

an output signal line, said output signal line adapted to carry said output signals;

a feedback circuit, said feedback circuit i) adapted to accept said output signals and a desired value of said output signals, and ii) adapted to stabilize said output signals with respect to said desired value; and an evaluation circuit, said evaluation circuit i) adapted to accept at least said current values when said output values are voltages and at least said voltage values when said output values are currents, and ii) adapted to monitor said output signal line for line faults.

2. The integrated circuit of claim 1 wherein said line faults include open circuits.

3. The integrated circuit of claim 1 wherein said line faults include short circuits.

4. The integrated circuit of claim 1 wherein said line faults include open circuits and short circuits.

5. The integrated circuit of claim 1 wherein said electronic output circuit includes a plurality of output stages.

6. The integrated circuit of claim 5 further comprising digital-to-analog converter, said digital-to-analog converter being shared by said plurality of output stages and providing setpoint output signals to said plurality of output stages.

7. The integrated circuit of claim 6 further comprising a demultiplexer, said demultiplexer allocating said digital-to-analog converter to said plurality of output stages in a time division manner.

8. The integrated circuit of claim 6 further comprising a logic unit, said logic unit triggering said plurality of output stages, monitoring said plurality of output stages, and adapted for communication with a higher order supervisory processing unit.

9. The integrated circuit of claim 7 further comprising a logic unit, said logic unit triggering said plurality of output stages, monitoring said plurality of output stages, and adapted for communication with a higher order supervisory processing unit.

10. The integrated circuit of claim 5 further comprising an external circuit element, said external circuit element allocated to one of said plurality of output stages, and adjusting the signal level range of said output signals.

11. The integrated circuit of claim 10 further comprising a logic unit, said logic unit triggering said plurality of output stages, monitoring said plurality of output stages, and adapted for communication with a higher order supervisory processing unit.

12. The integrated circuit of claim 5 further comprising a logic unit, said logic unit triggering said plurality of output stages, monitoring said plurality of output stages, and adapted for communication with a higher order supervisory processing unit.

13. An integrated circuit comprising:
   an electronic output circuit adapted to output electric signals and having means for adapting the electric signals to a signal-level range based on user input parameters, the electronic output circuit including a plurality of output stages from which the electric signals are output; and
   a digital-to-analog converter, said digital-to-analog converter being shared by said plurality of output stages and providing setpoint output signals to said plurality of output stages.

14. The integrated circuit of claim 13 further comprising a demultiplexer, said demultiplexer allocating said digital-to-analog converter to said plurality of output stages in a time division manner.

15. The integrated circuit of claim 14 further comprising a logic unit, said logic unit triggering said plurality of output stages, monitoring said plurality of output stages, and adapted for communication with a higher order supervisory processing unit.

16. The integrated circuit of claim 13 further comprising a logic unit, said logic unit triggering said plurality of output stages, monitoring said plurality of output stages, and adapted for communication with a higher order supervisory processing unit.

17. An integrated circuit comprising:
   an electronic output circuit adapted to output electric signals and having means for adapting the electric signals to a signal-level range based on user input parameters, the electronic output circuit including a plurality of output stages from which the electric signals are output; and
   an external circuit element, said external circuit element allocated to one of said plurality of output stages, and adjusting the signal level range of said output signals.

18. The integrated circuit of claim 17 further comprising a logic unit, said logic unit triggering said plurality of output stages, monitoring said plurality of output stages, and adapted for communication with a higher order supervisory processing unit.

19. An integrated circuit comprising:
   an electronic output circuit adapted to output electric signals and having means for adapting the electric signals to a signal-level range based on user input parameters, the electronic output circuit including a plurality of output stages from which the electric signals are output; and
   a logic unit, said logic unit triggering said plurality of output stages, monitoring said plurality of output stages, and adapted for communication with a higher order supervisory processing unit.

20. In an integrated circuit, a processor controllable output circuit for supplying an output signal determined by user selectable parameters including a signal type parameter and a signal range parameter comprising:
   an output stage, said output stage providing said output signal; and
   b) a logic unit, said logic unit,
      i) enabling said output stage,
      ii) monitoring the operation of said output stage, and
      iii) receiving from the processor, and storing, said user selectable parameters
   wherein said signal type parameter determines whether said output signal is a voltage signal or a current signal and wherein said signal range parameter determines the range of values of said output signal.

21. In an integrated circuit, a processor controllable output circuit for supplying output signals determined by user selectable parameters including a signal type parameters and a signal range parameters comprising:
   a) a plurality of output stages, said output stages providing said output signals;
   b) a digital-to-analog converter, said digital-to-analog converter converting a digital signal based on said user selectable parameters to an analog signal;
   c) a demultiplexer, said demultiplexer allocating said digital-to-analog converter to said plurality of output stages in a time division manner; and
   d) a logic unit, said logic unit,
      i) selectively enabling particular ones of said plurality of output stages,
      ii) monitoring the operation of said plurality of output stages,
      iii) receiving from the processor, and storing, said user selectable parameters,
      iv) providing said digital signal to, and controlling, said digital-to-analog converter, and
      v) controlling said demultiplexer,
   wherein said signal type parameters determine whether said output signals are voltage signals or current signals.

22. The output circuit of claim 21 wherein at least one of said plurality of output stages includes:
   an output channel;
   a current supply;
   a voltage supply; and
   a means for selecting, said means for selecting
      i) accepting a control signal from said logic unit, and
      ii) electrically connecting either said current supply or said voltage supply to said output channel based on said control signal,
   wherein said control signal is based on one of said signal type parameters.

23. The output circuit of claim 22 wherein said at least one of said plurality of output stages further includes:
   a first window comparator, said first window comparator indicating a short circuit when said voltage supply is electrically connected to said output channel and the magnitude of the current of said output signal is greater than a predetermined current magnitude; and a second window comparator, said second window comparator indicating an open circuit when said current supply is electrically connected to said output channel and the magnitude of the voltage of said output signal is greater than a predetermined voltage magnitude.

24. The output circuit of claim 22 further comprising an additional circuit element, said additional circuit element
   i) being electrically connected to said output channel of said one of said plurality of output stages, and
   ii) adjusting the range of any signal provided on said output channel.

25. The output circuit of claim 22 further comprising a controller, said controller
   i) being allocated to said at least one of said plurality of output stages,
   ii) accepting a desired value signal from said logic unit, and
   iii) adjusting any signal on said output channel to said desired value.

26. The output of claim 25 wherein said controller includes a feedback element.

27. The output circuit of claim 25 wherein said controller is includes a proportional feedback element and an integral feedback element.

28. The output circuit of claim 27 wherein said controller further includes a derivative feedback element.

29. An integrated electronic output circuit for outputting electric signals, said electronic output circuit including:
   i) means for operating the output circuit as one of a voltage-output circuit and a current output circuit based on a specified parameter indicating a type of signal;
   ii) means for feeding back one of a voltage value of the outputted electric signals and a current value of the outputted electric signals; and
   iii) means for stabilizing the outputted electric signals based on a value representing an intended electric signal to be outputted supplied to said means for feeding back.

30. The integrated electronic output circuit of claim 29 further comprising:
   iv) means for evaluating a line for the outputted electric signal for line faults including open circuits and short circuits; and
   v) means for supplying a voltage value of the outputted electric signals and a current value of the outputted electric signals to said means for evaluating.

31. The integrated electronic output circuit of claim 29 further comprising:
   iv) means for operating the output circuit based on a signal-level parameter which is specified in one of several signal-level ranges.

32. An integrated circuit comprising:
   i) an electronic output circuit for outputting electric signals;
   ii) means for operating said electronic output circuit as one of a voltage output circuit and a current output circuit based on a user specified parameter indicating a signal type;
   iii) means for feeding back one of a current value and a voltage value of the outputted electric signals; and
   iii) means for stabilizing the outputted electric signals based on a value representing an intended electric signal to be outputted supplied to said means for feeding back.

33. The circuit of claim 32 further comprising an additional electronic output circuit for outputting electric signals.

34. The circuit of claim 33 further comprising a digital-to-analog converter for supplying setpoint output signals to each of the electronic output circuit and the additional electronic output circuit.

35. The circuit of claim 32 further comprising an external circuit element coupled with said electronic output circuit, for changing the outputted electric signals such that they fall within a preselected range.

36. The circuit of claim 33 further comprising:
   a central processor; and
   a logic unit for triggering and for monitoring each of the electronic output circuit and the additional electronic output circuit and for communicating with said central processor.

* * * * *